(12) United States Patent
Canale et al.

(10) Patent No.: US 9,412,630 B2
(45) Date of Patent: Aug. 9, 2016

(54) SECURING MECHANISM AND METHOD FOR WAFER BONDER

(71) Applicant: Skyworks Solutions, Inc., Woburn, MA (US)

(72) Inventors: Steve Canale, Simi Valley, CA (US); David J. Zapp, Simi Valley, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 409 days.

(21) Appl. No.: 14/142,568

(22) Filed: Dec. 27, 2013

(65) Prior Publication Data

US 2014/0182762 A1 Jul. 3, 2014

Related U.S. Application Data

(62) Division of application No. 12/898,643, filed on Oct. 5, 2010, now Pat. No. 8,640,755.

(51) Int. Cl.
| | | |
|---|---|---|
| *B32B 37/00* | (2006.01) | |
| *H01L 21/673* | (2006.01) | |
| *B32B 37/10* | (2006.01) | |
| *H01L 21/768* | (2006.01) | |
| *H01L 21/67* | (2006.01) | |
| *H01L 21/683* | (2006.01) | |
| *B32B 38/00* | (2006.01) | |
| *B32B 38/18* | (2006.01) | |

(52) U.S. Cl.
CPC .......... *H01L 21/673* (2013.01); *B32B 37/1009* (2013.01); *H01L 21/67092* (2013.01); *H01L 21/6836* (2013.01); *H01L 21/76898* (2013.01); *B32B 38/0004* (2013.01); *B32B 38/1858* (2013.01); *B32B 2310/0843* (2013.01); *B32B 2457/14* (2013.01); *H01L 2221/6834* (2013.01); *H01L 2221/68327* (2013.01); *H01L 2221/68372* (2013.01); *Y10T 156/10* (2015.01); *Y10T 292/45* (2015.04)

(58) Field of Classification Search
CPC .............. B32B 37/1009; H01L 21/673; H01L 21/67092; H01L 21/76898; H01L 21/6836
USPC .................................................. 156/228, 285
See application file for complete search history.

(56) References Cited

U.S. PATENT DOCUMENTS

| | | | |
|---|---|---|---|
| 6,689,245 B2* | 2/2004 | Tsujimoto | ......... H01L 21/67132 156/230 |
| 8,196,632 B2* | 6/2012 | Tsujimoto | ......... H01L 21/67132 156/234 |
| 2007/0296035 A1 | 12/2007 | George et al. | |
| 2008/0138936 A1 | 6/2008 | Yamamoto et al. | |
| 2010/0032091 A1 | 2/2010 | Eichelberger | |

FOREIGN PATENT DOCUMENTS

JP 2004-153159 5/2004

OTHER PUBLICATIONS

International Search Report in PCT/US2011/054632, dated Apr. 27, 2012, in 3 pages

* cited by examiner

*Primary Examiner* — James Sells
(74) *Attorney, Agent, or Firm* — Knobbe, Martens, Olson & Bear LLP

(57) ABSTRACT

Disclosed are various features associated with a securing mechanism for a wafer bonder. In certain situations, operation of securing mechanisms can generate undesirable particles and debris, and some them can be introduced to a wafer being bonded. In certain implementations, a securing mechanism can be configured to reduce the likelihood of such particles and debris being introduced to the wafer.

20 Claims, 12 Drawing Sheets

SECURING MECHANISM AND METHOD FOR WAFER BONDER

RELATED APPLICATIONS

This application is a divisional of U.S. patent application Ser. No. 12/898,643, filed Oct. 5, 2010 now U.S. Pat. No. 8,640,755, entitled "SECURING MECHANISM AND METHOD FOR WAFER BONDER," the disclosure of which is hereby incorporated by reference in its entirety.

BACKGROUND

1. Field

The present disclosure generally relates to the field of semiconductor wafer processing technology, and more particularly, to a securing mechanism for a wafer bonding device.

2. Description of the Related Art

In certain processing operations involving thin and/or fragile wafers, it may be desirable to mount a wafer to a plate for support and easier handling. Such a mounting process is sometimes referred to as a bonding process, and can be achieved by, for example, using an adhesive.

In certain bonding processes, a wafer joined to a plate can be cured application heat. During such application of heat, it is generally desirable to apply uniform mechanical pressure so that the wafer and the plate become bonded in a generally parallel manner.

SUMMARY

In certain implementations, the present disclosure relates to an apparatus for bonding a wafer to a plate. The apparatus includes a base member having a receiving side dimensioned to receive a wafer and a plate that are configured to be bonded. The apparatus further includes a lid having first and second opposing sides and configured to be placed in an open position and a closed position relative to the base member. The open position facilitates positioning of the wafer and the plate on the base member for bonding and removing of the bonded assembly of wafer and plate from the base member after the bonding. The closed position facilitates the bonding of the wafer and the plate. The first side is dimensioned to engage the receiving side of the base member when the lid is in the closed position. The apparatus further includes one or more securing mechanisms. Each securing mechanism is configured to engage and apply a securing force on the second side of the lid from the second side of the lid when the lid is in the closed position to thereby push the lid against the receiving side of the base member.

In certain embodiments, the lid can include a solid plate between the first and second side of the lid. The receiving side of the base member and the first side of the lid can define a bonding chamber when the lid is in the closed position.

In certain embodiments, the lid can be configured so as to substantially separate the bonding chamber from the second side of the lid. The lid can further include a diaphragm disposed on the lid's first side. The diaphragm can be dimensioned and configured to provide a bonding force to the wafer and the plate during the bonding. The lid can include a pressure pathway between a portion of its first side and a location behind the diaphragm. The pressure pathway can allow gas pressure to be provided to the location to allow the diaphragm to provide the bonding force. The receiving side of the base member can define a pressure pathway configured to receive gas from a source and in communication with the pressure pathway of the lid so as to provide the gas pressure to the location behind the diaphragm. The base member can further include a suction opening in communication with a suction source. The suction opening can be disposed so as to hold the assembly of wafer and plate during the bonding.

In certain embodiments, the base member can further include first and second seals disposed on the receiving side. The first seal can be configured to provide a gas seal between the outside and the pressure pathway of the base member. The second seal can be configured to provide a gas seal between the pressure pathway of the base member and the bonding chamber.

In certain embodiments, the securing mechanism can include a clamping device mounted to a mounting structure that is coupled to the base member. The clamping device can have a push rod configured to engage and push against the second side of the lid with one of its ends to provide the securing force. The mounting structure can be positioned at a location outside the periphery of the base member and the periphery of the lid when the lid is in the closed position.

In certain embodiments, the securing mechanism can further include a support beam configured to couple the push rod to the mounting structure. The support beam can be further configured to position the push rod to a location that is within the periphery of the lid when the lid is in the closed position. The push rod and the support beam can be configured so as to allow adjustment of the push rod's length from the support beam to the end that engages the second side of the lid.

In certain embodiments, the securing mechanism can further include a locking handle configured to engage and lock the support beam when the push rod is providing the securing force to the second side of the lid. The locking handle can be configured to lock the support beam by a camming action.

In certain implementations, the present disclosure relates to a wafer bonding station having one or more of the apparatus summarized above.

In certain implementations, the present disclosure relates to a method for bonding a wafer to a plate. The method includes applying an adhesive between a wafer and a plate so as to form an assembly of the wafer and the plate. The method further includes positioning the assembly on a bonding area. The method further includes positioning a lid over the bonding area. The lid has an outside surface and an inside surface that is configured to facilitate application of pressure to the assembly. The method further includes applying a pushing force on the outside surface of the lid from the outside surface side of the lid so as to secure the lid in a substantially fixed orientation. The pushing force is directed along a direction having a component that is perpendicular to a plane defined by the wafer. The method further includes bonding the assembly by applying pressure and heat to the assembly.

In certain embodiments, the method can further include removing the pushing force on the outside surface of the lid upon completion of the bonding so as to allow the lid to be removed from the bonding area.

In certain implementations, the present disclosure relates to a device for securing a lid of a wafer bonding apparatus. The device includes a base coupled to a support structure of the wafer bonding device and disposed at a location that is outside the lid's periphery when the lid is in a closed position. The device further includes a support beam having a first end pivotably mounted to the base so as to allow the support beam to be placed in a disengagement position and an engagement position. The device further includes a push rod having an axis and mounted to the support beam at a mounting location on the support beam such that the push rod extends from the mounting location to a pushing end by a length at an angle relative to the support beam. The mounting location and the first end of the support beam are separated by a distance. At least one of the length, the angle, and the distance is selected so that when the support beam is in the engagement position, the pushing end of the push rod engages an upper surface of the lid in its closed position with the push rod's axis being less than approximately 20 degrees from a normal to a plane defined by the upper surface of the lid. The device further includes a locking mechanism configured to lock and unlock the support beam in and from, respectively, the engagement position.

In certain embodiments, the push rod's axis can be less than approximately 5 degrees from the normal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The headings provided herein, if any, are for convenience only and do not necessarily affect the scope or meaning of the claimed invention.

Figure 1:
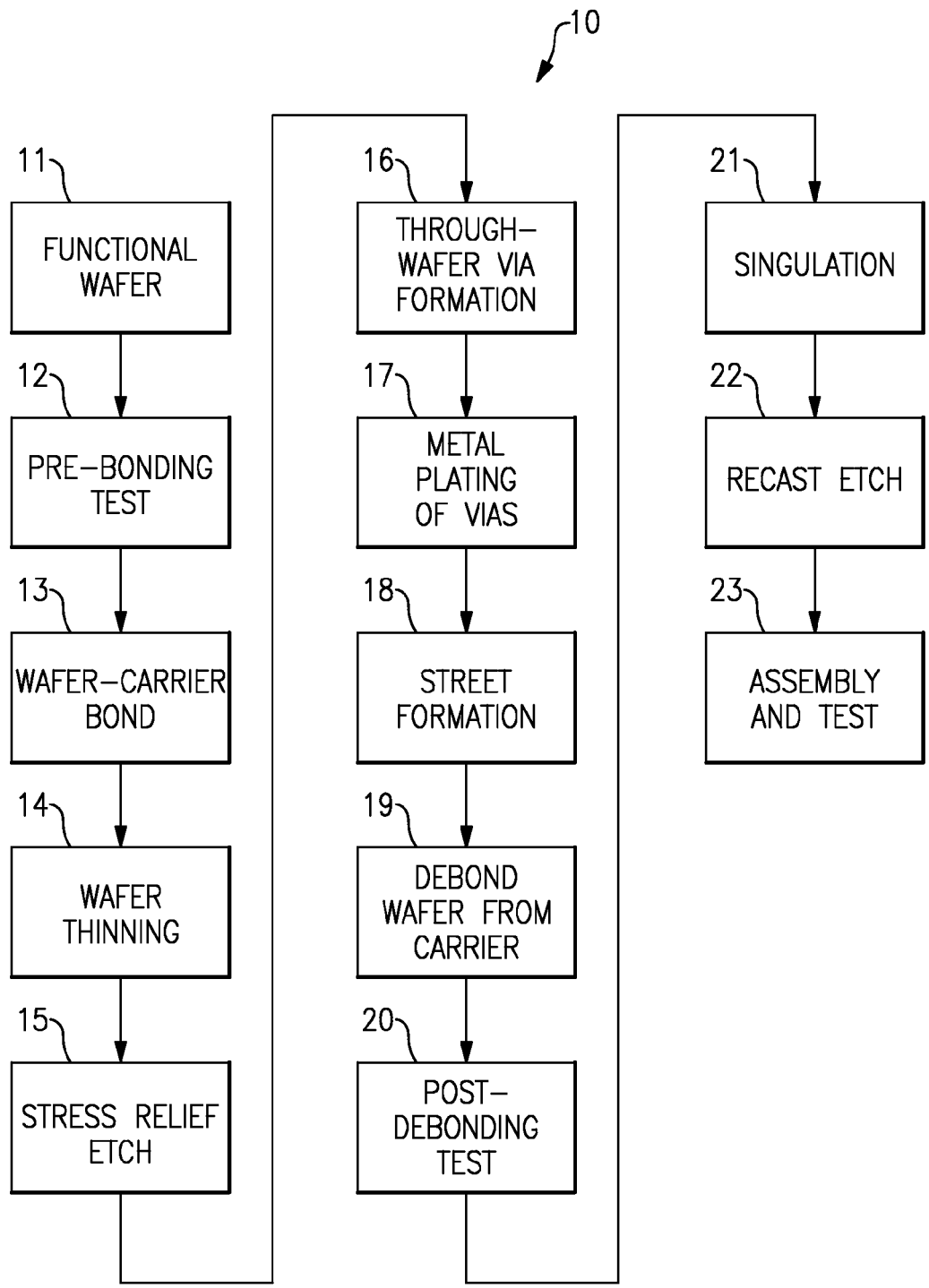
FIG. 1 shows an example sequence of wafer processing for forming through-wafer features such as vias.

Provided herein are various methodologies and devices for processing wafers such as semiconductor wafers. FIG. 1 shows an example of a process 10 where a functional wafer is further processed to form through-wafer features such as vias and back-side metal layers. As further shown in FIG. 1, the example process 10 can include bonding of a wafer to a carrier for support and/or to facilitate handling during the various steps of the process, and debonding of the wafer from the carrier upon completion of such steps. FIG. 1 further shows that such a wafer separated from the carrier can be further processed so as to yield a number of dies.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
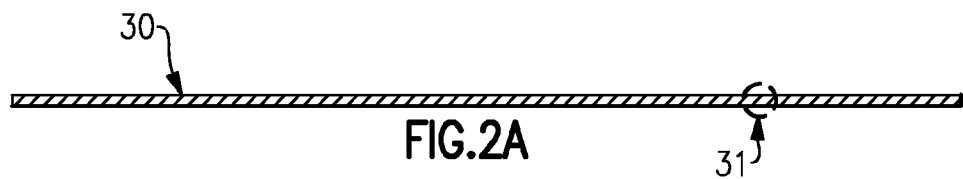
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
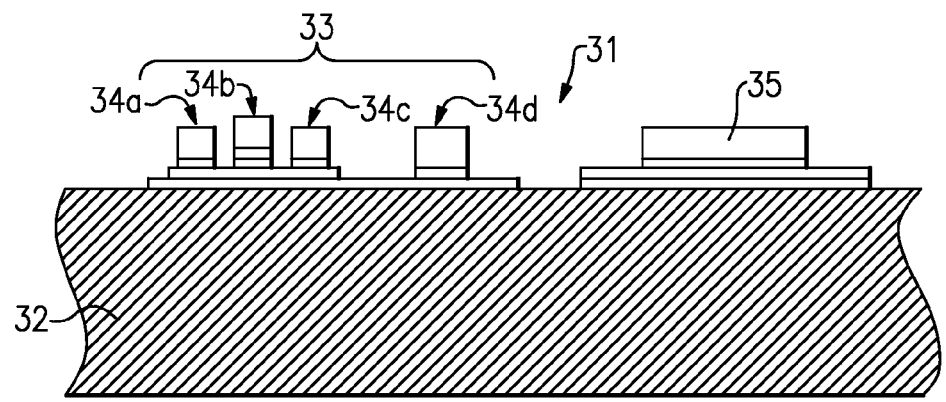

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34$b$, bases 34$a$, 34$c$, and a collector 34$d$. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
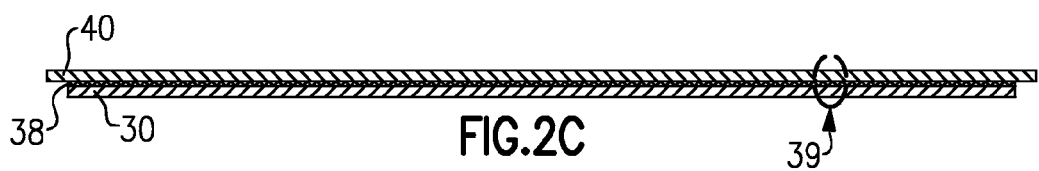

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding step 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections)

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate diameter range | Carrier plate thickness range | Wafer size |
|---|---|---|
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
|---|---|---|
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
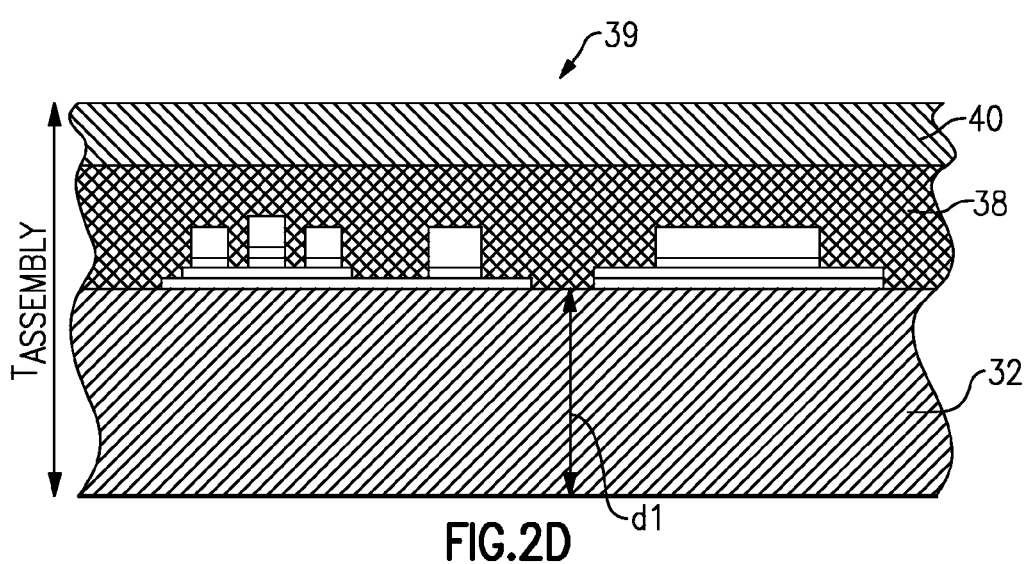

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of d1, and the carrier plate 40 has a generally fixed thickness (e.g., one of the thicknesses in Table 1). Thus, the overall thickness ($T_{assembly}$) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
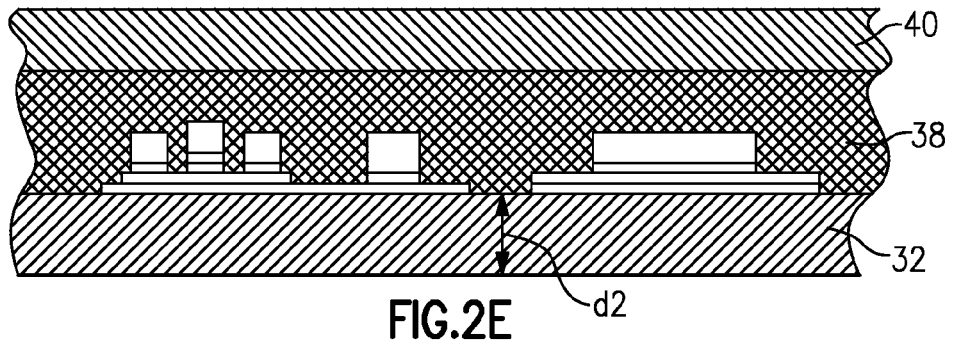

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via two-step grind with coarse and fine diamond-embedded grinding wheels) so as to yield an intermediate thickness-substrate (with thickness d2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an O2 plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O_2$ and/or $H_2O$. Such an etching process can provide relief from possible stress on the wafer due to the rough ground surface.

Figure 2F:
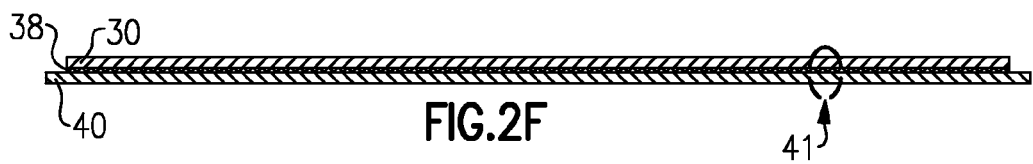
Figure 2G:
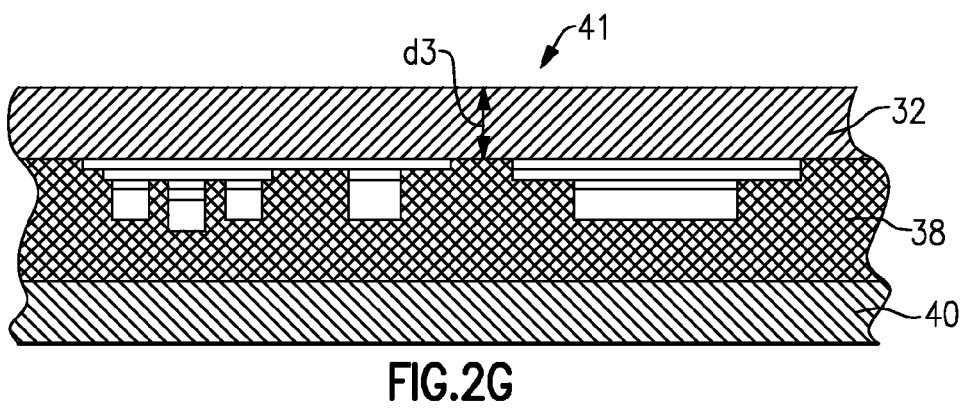

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of d3.

By way of an example, the pre-grinding thickness (d1 in FIG. 2D) of a 150 mm (also referred to as "6-inch") GaAs substrate can be approximately 675 µm. The thickness d2 (FIG. 2E) resulting from the grinding process can be in a range of approximately 102 µm to 120 µm. The ash and etching processes can remove approximately 2 µm to 20 µm of the rough surface so as to yield a thickness of approximately 100 µm. (d3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
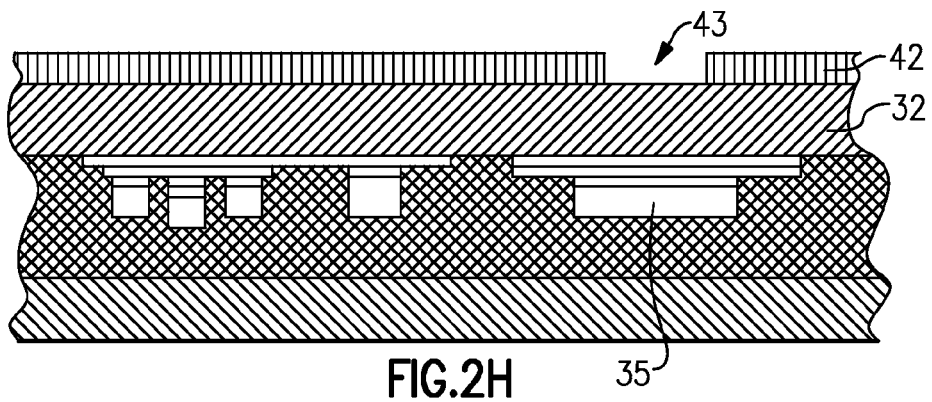
Figure 2I:
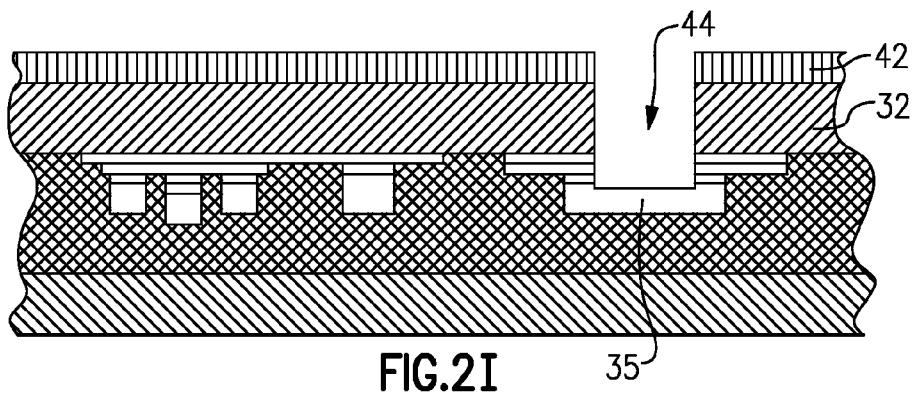
Figure 2J:
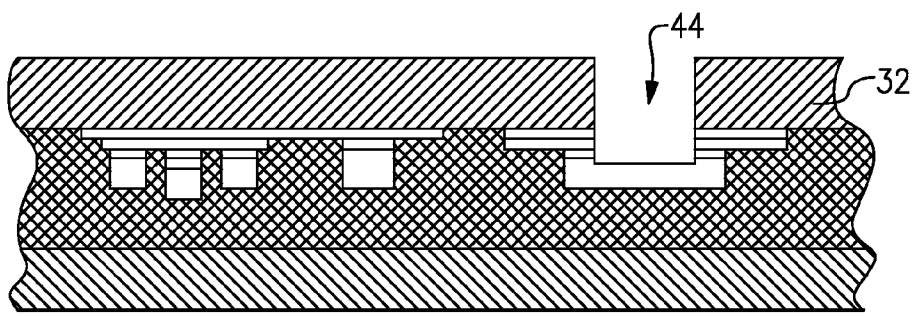

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness in a range of about 15 µm to 20 µm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. In various implementations, a desired shaped via can be an important design parameter for facilitating proper metal coverage therein in subsequent processes.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
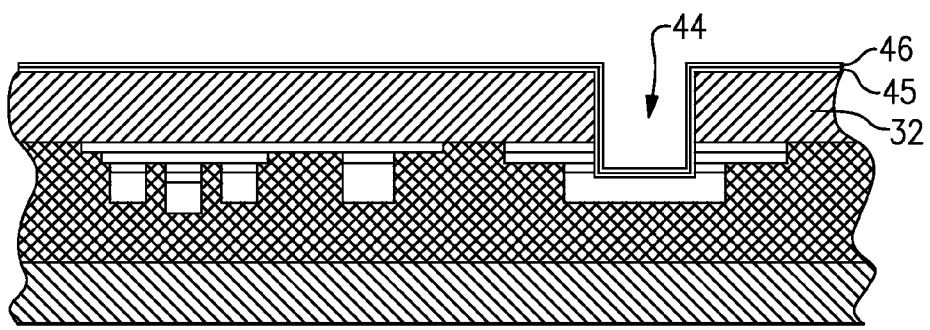
Figure 2L:
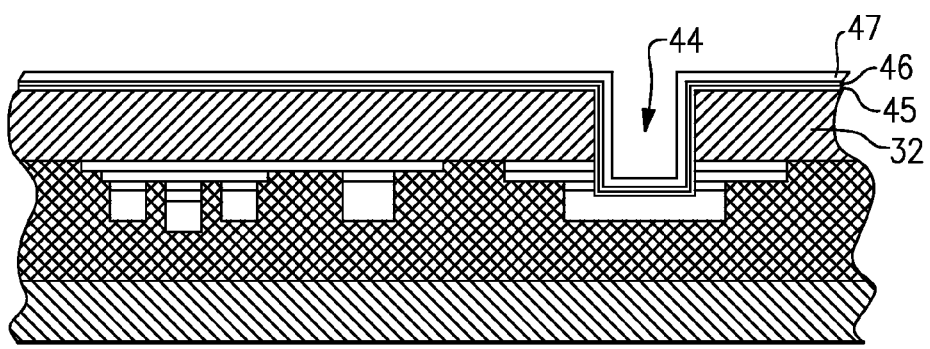

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 such as a thick gold layer shown in FIG. 2L. In certain implementations, the thick gold layer can be formed by a plating technique.

In certain implementations, the gold plating process can be performed after a pre-plating cleaning process (e.g., $O_2$ plasma ash and HCl cleaning). The plating can be performed to form a gold layer of about 3 μm to 6 μm to facilitate the foregoing electrical connectivity and heat transfer functionalities. The plated surface can undergo a post-plating cleaning process (e.g., $O_2$ plasma ash).

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
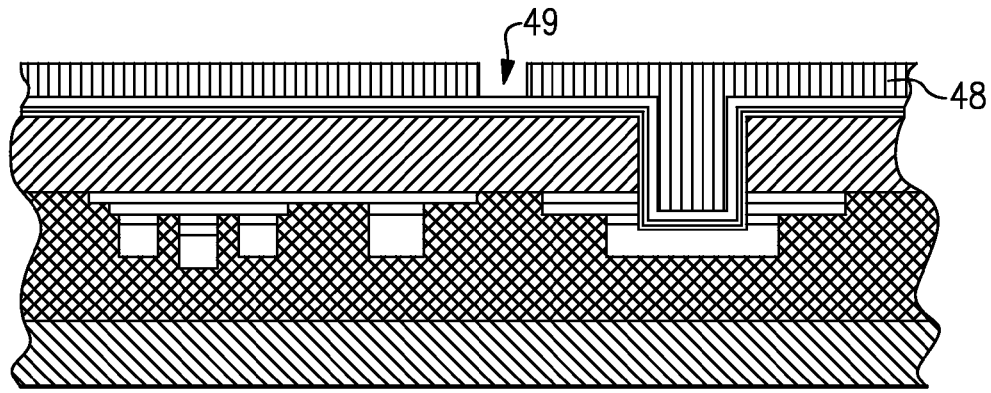
Figure 2N:
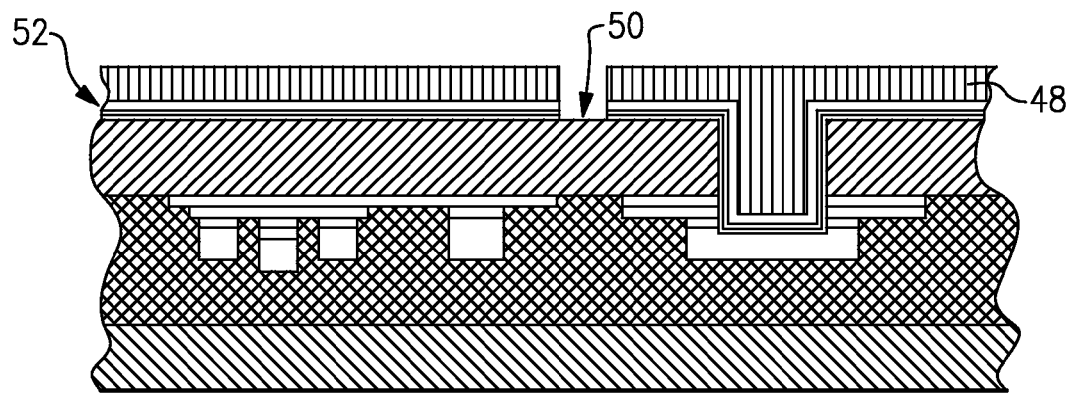
Figure 2O:
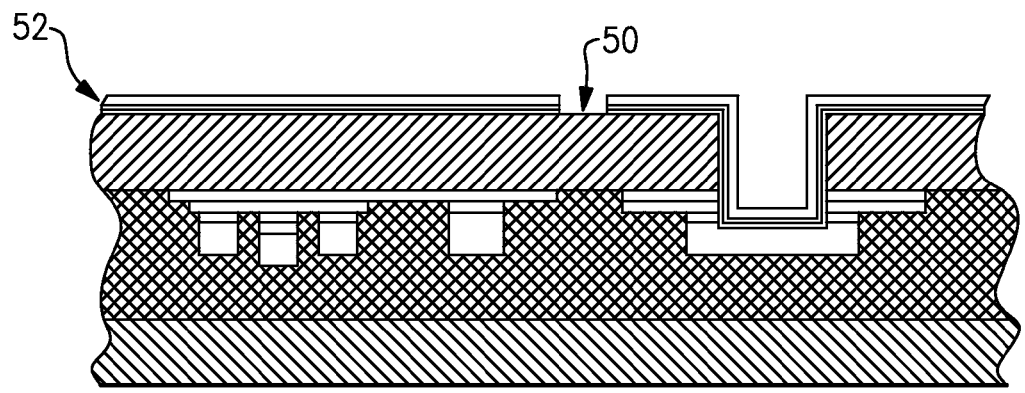

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., $O_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., $O_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
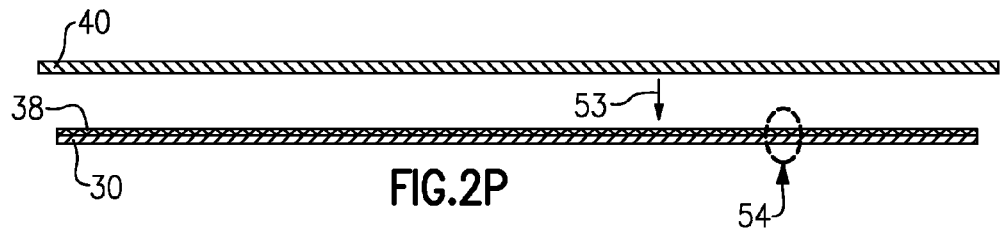

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature to a range of about 130° C. to 170° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
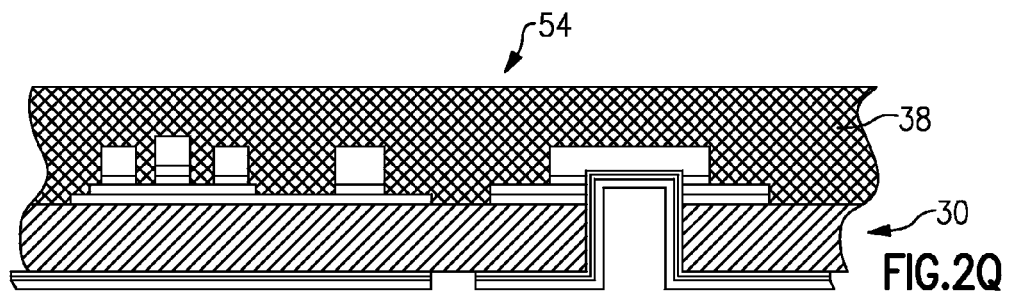

In FIGS. 2P and 2Q, the adhesive layer 38 is depicted as remaining with the wafer 30 instead of the carrier plate 40. It will be understood that some adhesive may remain with the carrier plate 40.

Figure 2R:
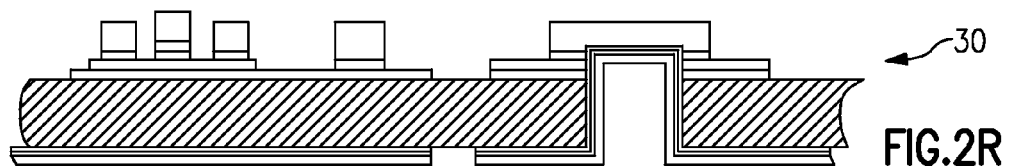

FIG. 2R shows the adhesive 38 removed from the front side of the wafer 30. The adhesive can be removed by a cleaning solution (e.g., acetone), and remaining residues can be further removed by, for example, a plasma ash (e.g., $O_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
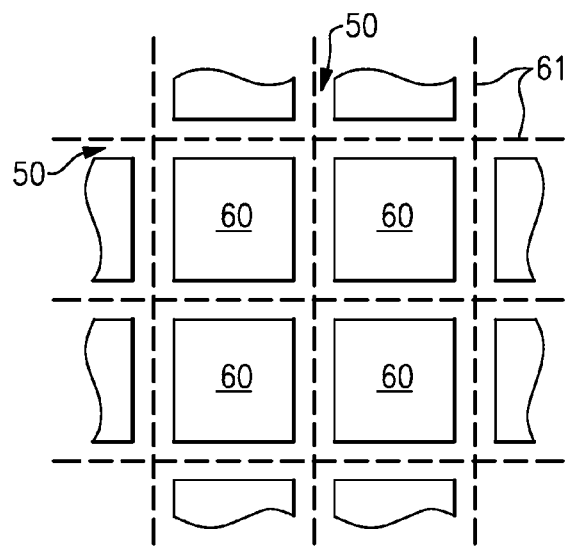

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
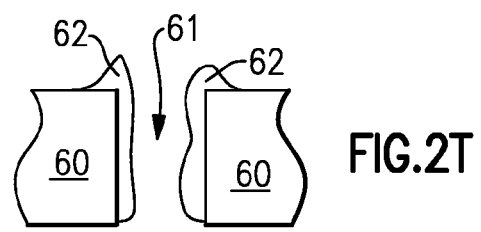

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
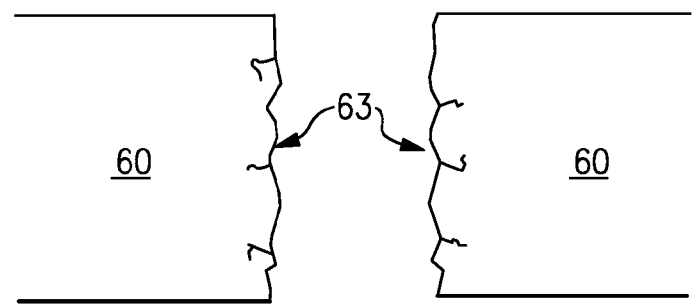
Figure 2V:
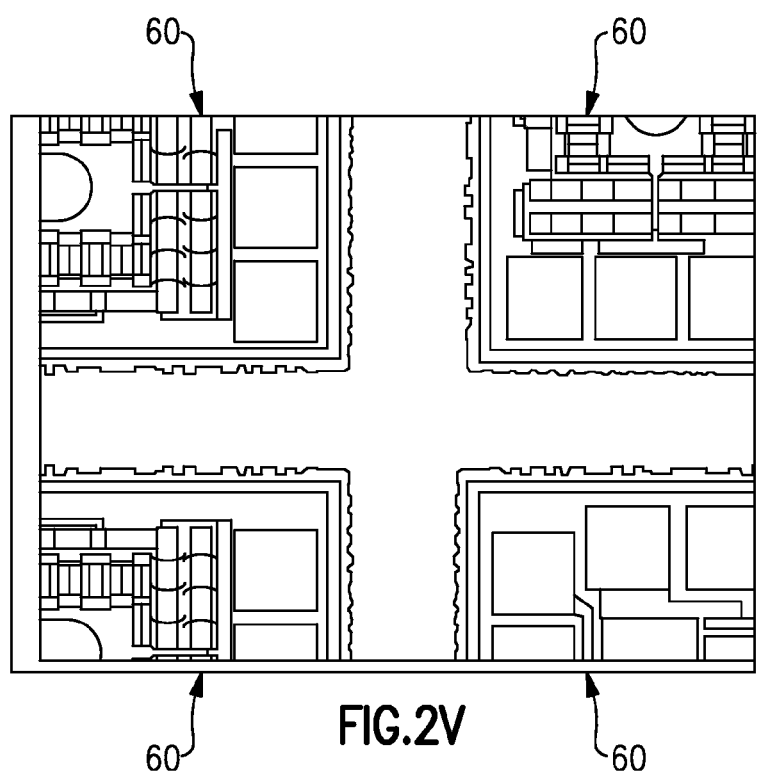

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

As described herein in reference to FIGS. 1 and 2, some operations in the process 10 can benefit from having a wafer temporarily bonded to a carrier plate. Once such operations are completed, the wafer can be removed or debonded from the carrier plate. FIGS. 3-7 show by way of examples a bonding apparatus having a securing mechanism that reduces the likelihood of unwanted debris or small objects being introduced into an area where the bonding process occurs.

It will be understood that one or more features associated with debonding devices and methodologies can be implemented in the example through-wafer via process described in reference to FIGS. 1 and 2, as well as in other processing situations. It will also be understood that one or more features associated with debonding devices and methodologies can be implemented in different types of semiconductor-based wafers, including but not limited to those formed from semiconductor materials such as groups IV, III-V, II-VI, I-VII, IV-VI, V-VI, II-V; oxides; layered semiconductors; magnetic semiconductors; organic semiconductors; charge-transfer complexes; and other semiconductors. Further, some of the features described herein can also be implemented in situations involving separation of non-semiconductor-based wafers from another structure.

Various wafer processing operations can be performed in controlled environments such as those associated with various clean rooms. Among other controlled environmental factors, "cleanliness" of a clean room greatly reduces the concentration of small particles (e.g., dust particles, lint, etc.) circulating in the air so as to reduce the likelihood of such particles settling on wafers. Detrimental effects of such particles on wafers are known.

Figure 3A:
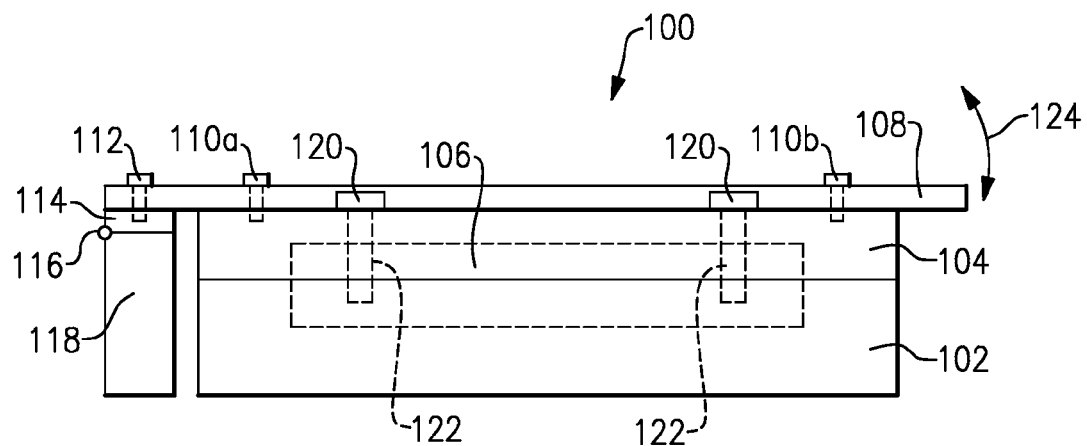
FIGS. 3A and 3B show an example of a bonding apparatus where a number of securing mechanisms such as threaded bolts extend through or near a wafer bonding chamber such that undesirable particles generated by the mechanism can be introduced to the wafer.
Figure 3B:
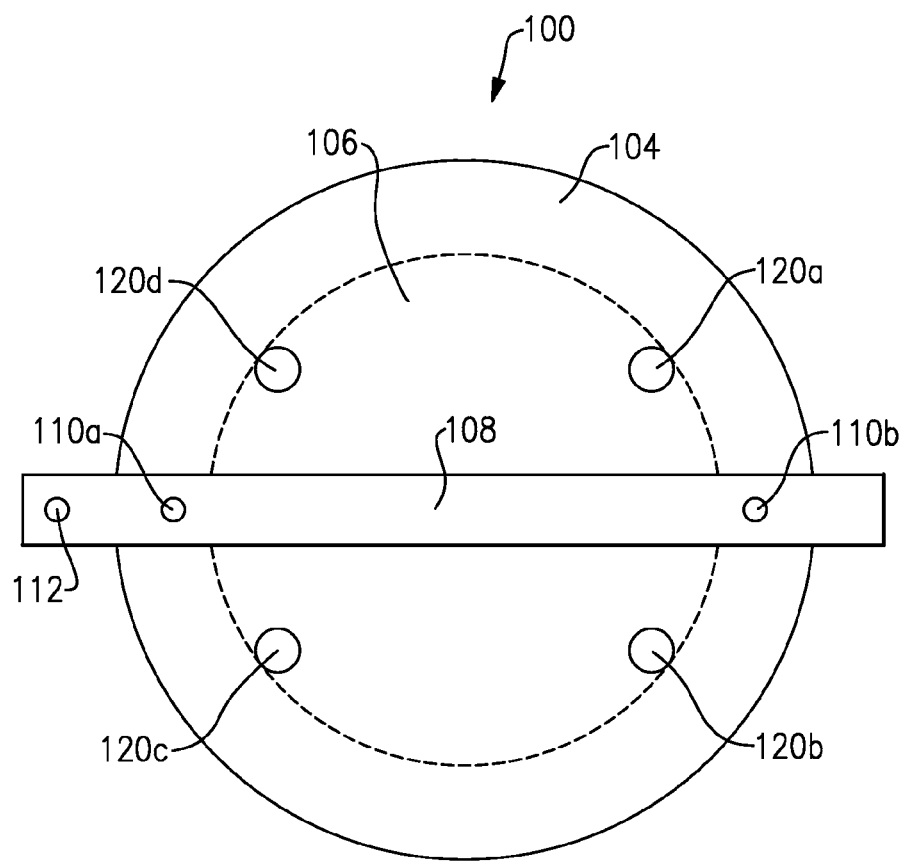

FIGS. 3A and 3B show side and plan views of a bonding apparatus 100 having a lower member 102 and an upper member 104. The lower member 102 and/or the upper member 104 can define a bonding chamber 106 where a wafer (not shown) can undergo a bonding process with a carrier plate (not shown). In some situations, such a bonding process can involve curing of an adhesive that has already been applied (e.g., spun on). Such a curing process can be facilitated by an application of heat. The bonding apparatus 100 can be configured appropriately so as to yield a bonded assembly of wafer and carrier plate where the wafer and the carrier plate are substantially parallel.

The upper member 104 can be moved (depicted as an arrow 124) so as to allow it to open and close the bonding chamber 106. The upper member 104 can be opened to allow loading of the uncured wafer-carrier assembly and unloading of the cured wafer-carrier assembly. The upper member 104 can be closed facilitate the curing process.

The opening and closing of the upper member 104 can be facilitated by a handle 108 that is attached to the upper member 104 by, for example, one or more screws 110. The handle 108 can also be attached to a hinge 114 by, for example, one or more screws 112. The hinge 114 can be coupled to a support member 118 through a pivot 116 so at to allow the upper member 104 to rotate between its open and closed positions about the pivot 116.

When in the closed position, the upper member can be secured to the lower member by a number of screws 120. In the example shown in FIG. 3B, four of such screws (120a-120d) are depicted as being distributed circumferentially so as to provide a distributed securing force. As shown in FIG. 3A, each of the screws 120 can include a threaded portion 122 that extends through the upper member 104 to engage a portion of the lower member 102, thereby allowing the screw to be tightened to secure the upper member 104 to the lower member 102.

Tightening and removing of the screws 120 involve surface engagements between the threaded portions 122 of the screws 120 and their respective matching threads on the lower member 102. Consequently, such surface engagements can result in small metal and other particles being generated and falling or somehow being introduced into the bonding chamber 106. Some of such particles can become undesirably attached to a wafer being bonded therein.

In the example shown in FIGS. 3A and 3B, the screws 120 are depicted as extending into the bonding chamber 106. However, even if the screws 120 do not invade the bonding chamber 106, they need to extend through the mating surfaces of the upper and lower members 104, 102. Consequently, any undesirable particles resulting from the thread engagements can collect on either or both of the mating surfaces, and move into the bonding chamber 106 during the opening and closing operations.

FIGS. 4-7 show various examples of a securing mechanism that can secure upper and lower members 220, 222 of a bonding apparatus 202 in a manner where the likelihood of introduction of undesirable particles from the securing mechanism into the bonding chamber is reduced or substantially eliminated. In certain implementations, such a reduction can be achieved by configuring the securing mechanism to reduce the amount of undesirable particles being generated and/or to provide the securing force without having to pull the upper and lower members 220, 222 together by a structure that extends through one of the members (e.g., upper member 220) into the other (e.g., lower member 222).

Figure 4:
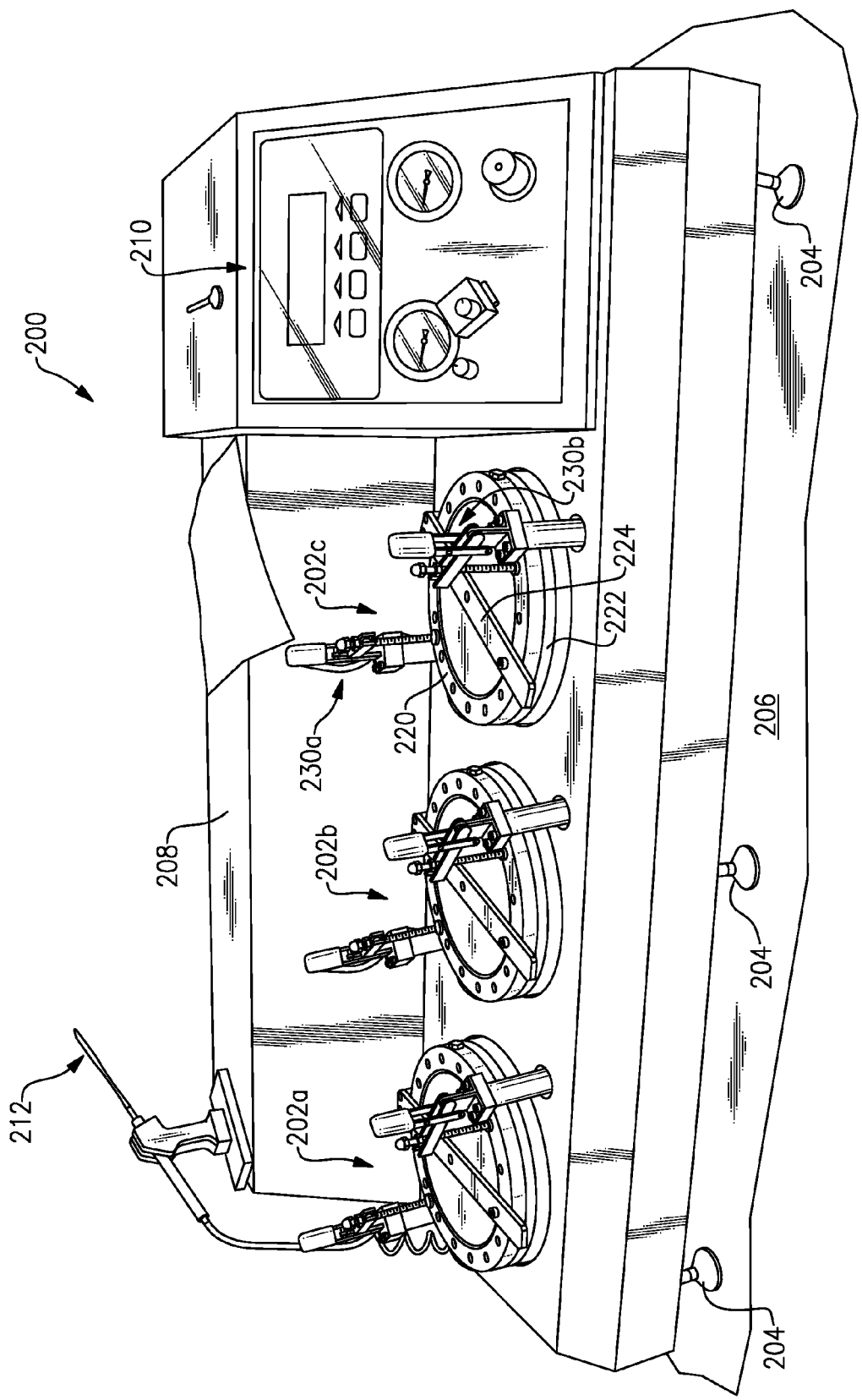
FIG. 4 shows an example wafer bonding station having a number of bonding apparatus, each having one or more securing mechanisms that reduce the likelihood of the undesirable effect associated with FIGS. 3A and 3B.

FIG. 4 shows an example bonding station 200 having a number of the wafer bonding apparatus 202. In certain embodiments, the upper member 220, the lower member 222, and the handle 224 configured to operate in manners similar to those (104, 102, 108) described in reference to FIGS. 3A and 3B. In certain embodiments, the upper member 220 can be secured to the lower member 222 by one or more securing mechanisms 230 as described herein.

FIG. 4 shows that the example bonding station 200 can include a base (within the housing 208) that supports the lower members 222. The base can also be mechanically coupled to support legs 204 to facilitate positioning of the station 200 on a surface 206. The station 200 can also include a control component 210 for controlling various operating parameters such as temperature for curing of the adhesive, gas pressure for applying pressing the wafer and carrier plate in a controlled manner, and vacuum for holding the wafer-carrier assembly during the curing process. In FIG. 4, a vacuum handling wand 212 is also shown. Such a device can be used to manipulate the wafer-carrier assembly during loading and unloading operations.

In certain embodiments, each bonding apparatus 202 can include one or more securing mechanisms 230. In the example shown, there are two of such mechanisms 230a, 230b for each bonding apparatus 202. In other embodiments, the number of such mechanisms can also be greater than or less than two.

Figure 5A:
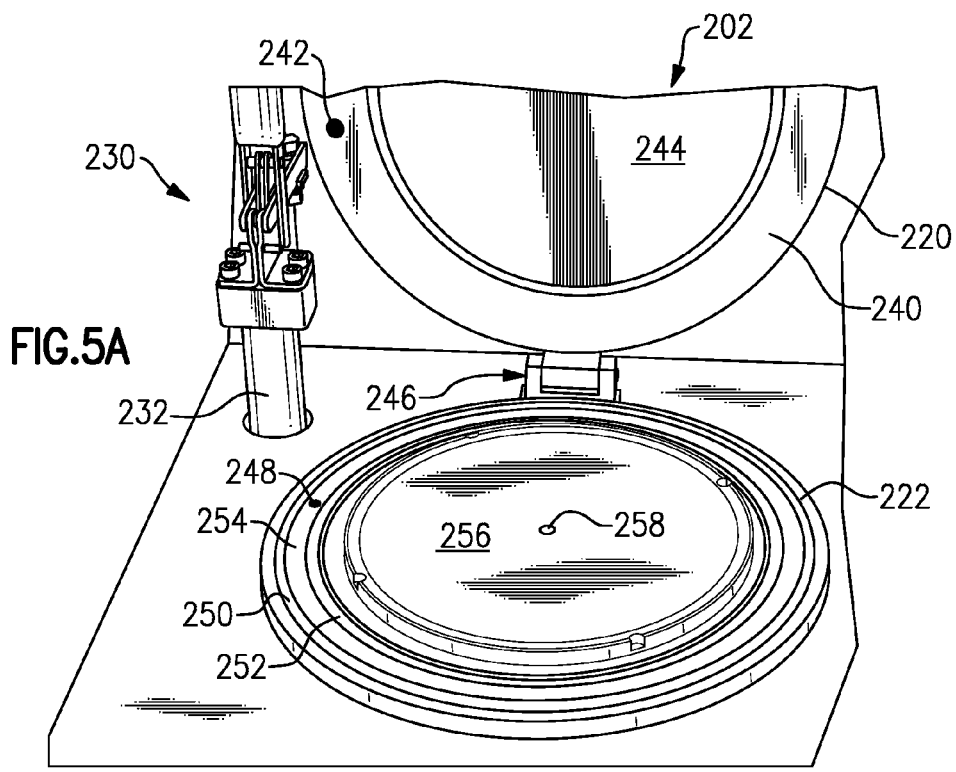
FIGS. 5A and 5B show the bonding apparatus of FIG. 4 in its open and closed configurations.
Figure 5B:
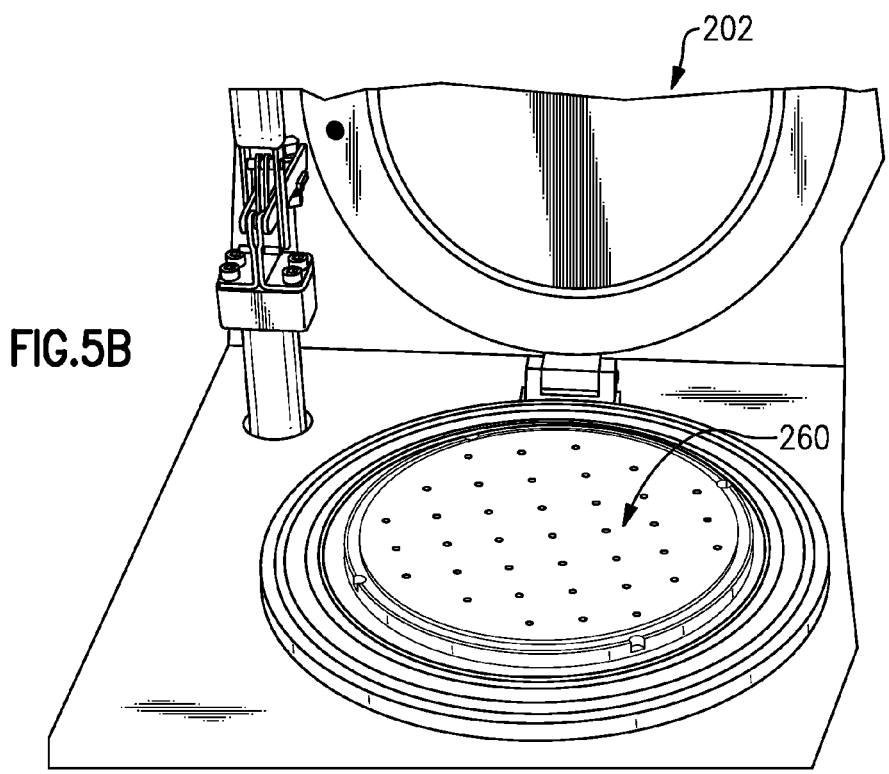

FIGS. 5A and 5B show the bonding apparatus 202 with (FIG. 5B) and without (FIG. 5A) a wafer-carrier assembly 260 in the bonding chamber. With the upper member 220 in its upper position (e.g., rotated open about a pivot 246), one can see that the bonding chamber can include a platform surface 256 dimensioned to receive the wafer-carrier assembly 260. The surface 256 can define a vacuum aperture 258 in communication with a vacuum device (not shown) and configured to provide a suction hold of the wafer-carrier assembly 260. Such a vacuum aperture 258 can also facilitate removal of gas pockets that may have formed between the surface 256 and the wafer-carrier assembly 260.

The upper member 220 can include a pneumatic diaphragm 244 configured to provide a wide pushing force on the wafer-carrier assembly 260 during the curing process. The diaphragm 244 can be actuated by pressurized gas delivered through an aperture 242 in communication with a region behind the diaphragm 244. The aperture 242 on the upper member 220 can be in communication with a ring space 254 defined between inner and outer sealing rings 252, 250 and a pressure input aperture 248. Thus, when the upper member 220 is lowered onto the lower member 222, the upper member's engaging surface 240 engages with the sealing rings 252, 250 to separate the pressure system (including the ring space 254) from the vacuum system of the bonding chamber and from the outside.

Referring to FIG. 5A, the securing mechanism 230 can be secured to the base (not shown) by a support bar 232.

Figure 6A:
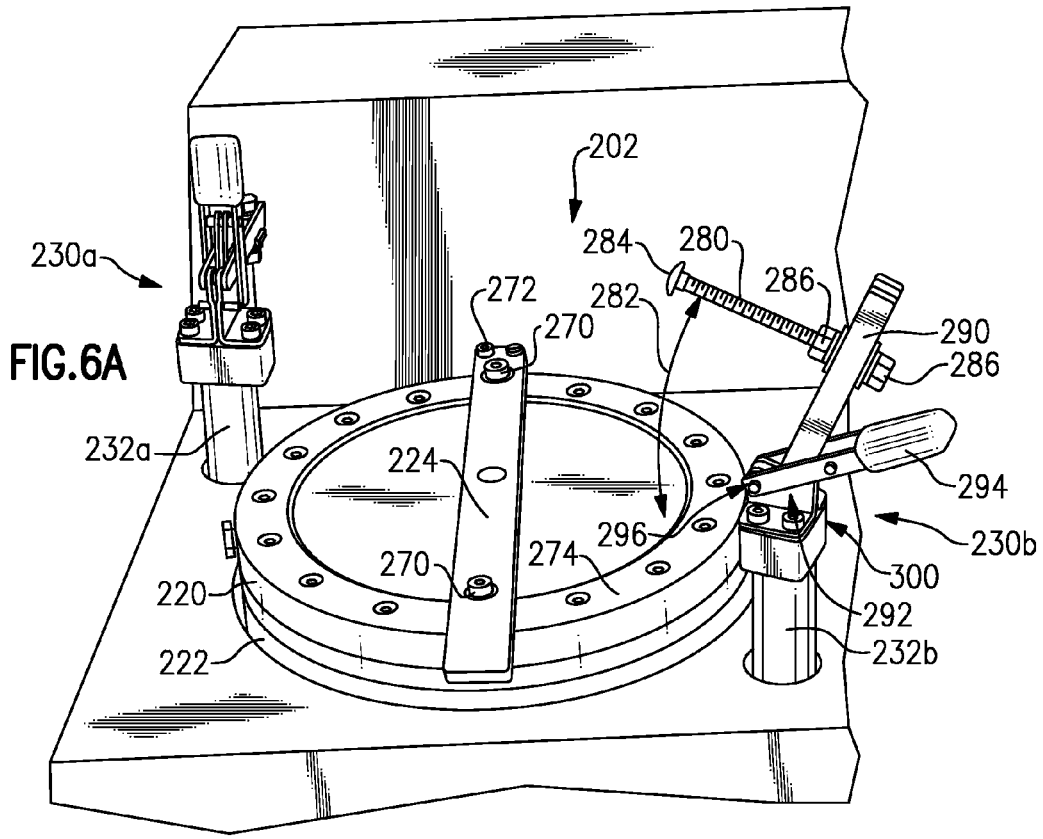
FIGS. 6A and 6B show the bonding apparatus of FIG. 4 in the closed configuration, before and after application of securing force by the securing mechanisms.

In FIG. 6A, the upper member 220 has been lowered to its closed position so as to engage the lower member 222. Such closing and opening operations can be facilitated by the handle 224 attached to the upper member 220 by one or more fasteners such as screws 270. The handle 224 is depicted as being mounted to a hinge by one or more fasteners such as screws 272.

Figure 6B:
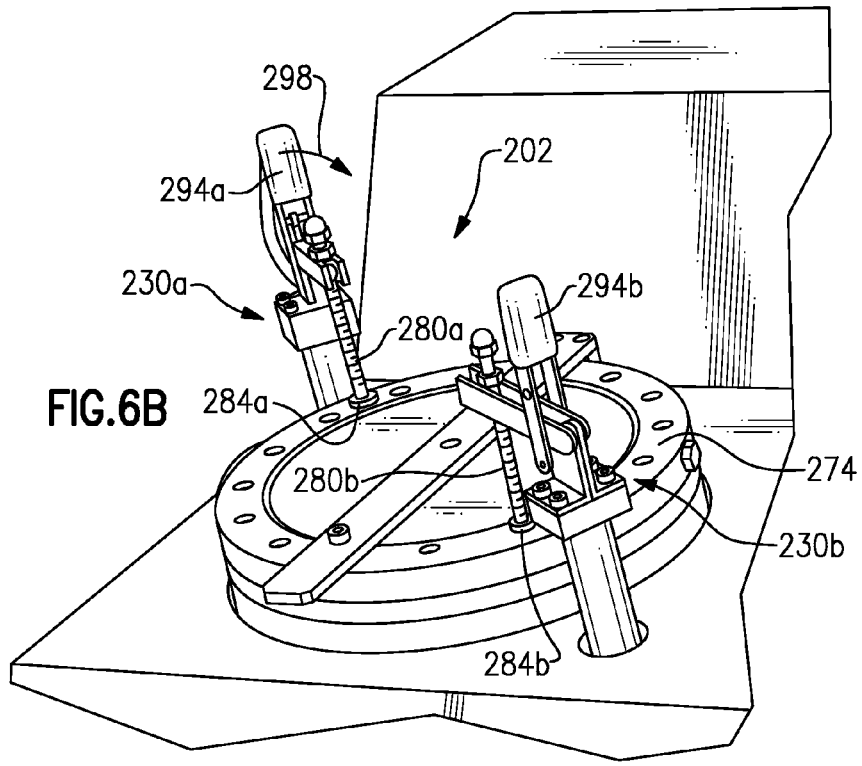

In FIG. 6A, the upper member 220 has been lowered but not secured by the securing mechanisms 230a, 230b. In FIG. 6B, the securing mechanisms 230a, 230b are in their secured positions.

In certain implementations, each of the securing mechanism 230 can include a base 300 that is mounted on the support bar 232 in a manner that allows the securing mechanism 230 to rotate with the support bar 232 (about axis of the support bar 232) to facilitate the opening and closing of the upper member 220. Once the securing mechanism 230 in rotated to allow engagement with the upper member 220 (230b in FIG. 6A), a push rod 280 can be swung down (arrow 282) so that its engagement end 284 can engage the upper surface 274 of the upper member 220. Upon engagement, the push rod 280 can be pushed further against the upper surface 274 and generally maintained there so as to secure the upper member 220 against the lower member 222.

In certain embodiments, the securing mechanism 230 can include a support beam 290 that is pivotably mounted (292) to the base 300 (of the securing mechanism 230). The push rod 280 can be mounted at a distance from the pivot 292 so that the pivot 292 facilitates the movement 282 of the push rod towards and away from the upper surface 274 of the upper member 220. In certain embodiments, the push rod's orientation relative to the support beam 290 can be approximately perpendicular; however, the angle between the two can be greater or less than 90 degrees to facilitate an appropriate securing engagement of the push rod 280 with the upper member 220.

In certain embodiments, the distance between the push rod's engagement end 284 and its mounting location on the support beam 290 can be adjusted to facilitate, for example, the amount of push force applied to the upper member. In the example shown, the push rod 280 can include a threaded portion so as to be mounted to the support beam 290 by threaded nuts 286. Accordingly, the push rod 280 can be moved relative to the support beam 290 by loosening and tightening the nuts 286 appropriately.

In certain embodiments, the location where the push rod 280 is mounted (to the support beam 290) can be selected so that when secured, the push rod 280 pushes on a selected location (e.g., a peripheral portion) of the upper surface 274. In the example shown in FIGS. 6A and 6B, the mounting location of the push rod 280 along the support beam 290 can be adjusted by loosening one or more of the nuts 286, sliding the mounting to a desired location on the support beam 290, and tightening the nut(s) 286. Thus, as shown in FIG. 6B, two such pushing forces (provided by the two example push rods) on the upper member 220 can provide a distributed securing force on the upper member 220.

In certain embodiments, a plurality of such securing mechanisms 230 can be distributed generally uniformly about the upper member 220. In the example shown, the two securing mechanisms 230 are depicted as being distributed with about 180-degree separation.

In certain embodiments, the securing mechanism 230 can include a locking handle 294 that is configured to push the push rod 280 (through the support member 290) into its securing position and lock the securing mechanism 230 in such a position. To provide such a feature, the locking handle 294 can be pivotably mounted (296) to the base and include a locking mechanism (e.g., a camming action) that locks the securing mechanism 230 by pushing the handle 294 towards the center of the upper member 220 after the placement of the push rod 280 on the upper member 220. Unlocking of the securing mechanism 230 can be achieved by pushing the handle 294 away from the center of the upper member 220 to thereby allow the push rod 280 to be moved away from the upper member 220.

In certain implementations, a securing mechanism having some or all of the foregoing features can be configured to provide an amount of force that results in an acceptable sealing functionality of the seals 250, 252. On the other hand, the amount of force is preferably less than an amount that would crush the seal(s) and possibly damage the wafer-carrier assembly.

In certain implementations, the amount of force can also be selected so to overcome the tendency of the upper member 220 to separate from the lower member 222 as the diaphragm 244 pushes on the wafer-carrier assembly.

Figure 7:
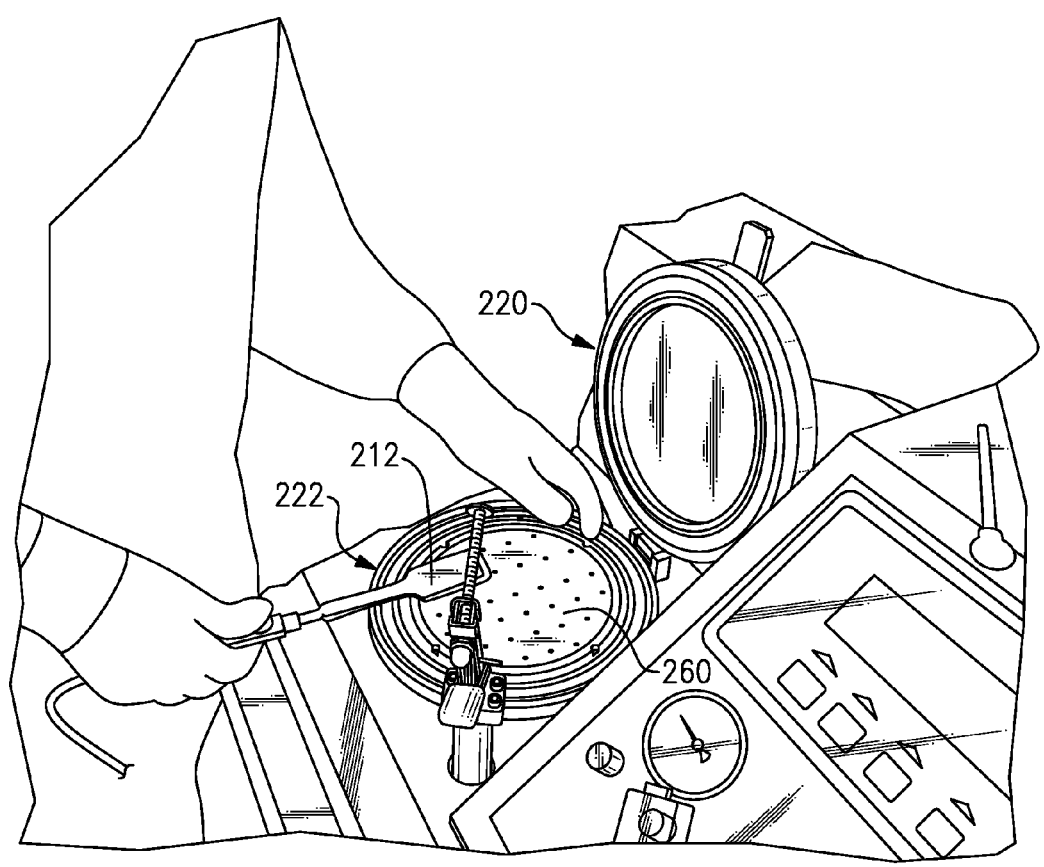
FIG. 7 shows the bonding apparatus of FIG. 4 where the bonding process has been completed.

FIG. 7 shows the upper member 220 in its open position after the completion of a bonding process. The bonded wafer-carrier assembly 260 is depicted as being removed from the lower member 222 by the vacuum handling device 212 previously referred to in FIG. 4.

In the non-limiting example described herein, the securing mechanism is configured to operate as a clamp or a clamp-like device to provide a pushing force on the upper member (also referred to as a lid herein). It will be appreciated that a number of other designs can also be implemented to provide one or more functionalities as described herein.

As described herein, the lid can include first and second opposing sides, with the first side dimensioned to engage a receiving side of the lower member (also referred to as a base member herein) base member when the lid is in the closed position, and with the second side separated from the first side by a substantially solid plate. Such a separation of the first and second sides of the lid by the plate reduces the likelihood that undesirable particles originating from the operation of the securing mechanism will be introduced to the first side of the lid and/or the bonding chamber.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for bonding a wafer to a plate, the method comprising:
    applying an adhesive between a wafer and a plate so as to form an assembly of the wafer and the plate;
    positioning the assembly on a bonding area;
    positioning a lid over the bonding area, the lid having an outside surface and an inside surface, the inside surface configured to facilitate application of pressure to the assembly;
    applying a pushing force on the outside surface of the lid so as to secure the lid in a substantially fixed orientation, the inside surface of the lid and the bonding area forming at least part of a bonding chamber dimensioned to hold the assembly when the lid is positioned over the bonding area and secured in the substantially fixed orientation, the pushing force directed along a direction having a component that is perpendicular to a plane defined by the wafer, the pushing force applied external to the bonding chamber; and
    bonding the assembly by applying at least heat to the assembly.

2. The method of claim 1 further comprising, upon completion of the bonding, removing the pushing force on the outside surface of the lid so as to allow the lid to be removed from the bonding area.

3. The method of claim 1 wherein said bonding includes engaging a diaphragm disposed from the inside surface of the lid.

4. The method of claim 3 wherein said bonding further includes applying gas pressure to the diaphragm via a pressure pathway formed between a portion of the outside surface of the lid and the diaphragm.

5. The method of claim 1 wherein said applying includes using a push rod to apply the pushing force to the outside surface of the lid.

6. The method of claim 5 further comprising, prior to said applying, moving a support structure that supports the push rod so as to position the push rod over the lid and within the periphery of the lid when the lid is in the closed position.

7. The method of claim 6 further comprising locking the support structure into during said applying.

8. The method of claim 5 wherein said using the push rod includes lowering a pushing end of the push rod towards the outside surface of the lid until the pushing end contacts the outside surface of the lid.

9. A method for securing a lid of a wafer bonding device, the method comprising:
    positioning a wafer and a plate on a wafer bonding device;
    positioning a lid of the wafer bonding device over the wafer and plate in a closed position, a receiving surface that is supported by a support structure of the wafer bonding device, together with an underside of the lid, forming a bonding chamber being configured to hold the wafer and the plate when the lid is in the closed position; and
    while the lid is in the closed position, moving an elongate pushing member from a disengaged position in which the elongate pushing member is not in contact with the lid into an engaged position in which a pushing end of the elongate pushing member engages an upper surface of the lid externally to the bonding chamber.

10. The method of claim 9 wherein when the elongate pushing member is in the engaged position, an axis of the elongate pushing member is less than approximately 20 degrees from normal to a plane defined by the upper surface of the lid.

11. The method of claim 10 wherein the axis of the elongate pushing member is less than approximately 5 degrees normal to the plane defined by the upper surface of the lid.

12. The method of claim 10 further comprising bonding the wafer to the plate by applying at least heat to the wafer and the plate.

13. A method for bonding a wafer to a plate, the method comprising:
    positioning a lid over an assembly resting on a first surface beneath the lid, the assembly comprising a wafer and a plate, the lid having a top surface and a bottom surface, at least a portion of the bottom surface dimensioned to effect application of pressure to the wafer and the plate;
    applying a downwards pushing force to the top surface of the lid; and
    bonding the assembly by applying one or more of pressure and heat to the assembly.

14. The method of claim 13 further comprising, upon completion of said bonding, removing the pushing force from the top surface of the lid so as to allow the lid to be raised.

15. The method of claim 13 wherein said bonding includes engaging a diaphragm disposed on the bottom surface of the lid.

16. The method of claim 13 wherein said applying includes employing a push rod to apply the pushing force to the top surface of the lid.

17. The method of claim 16 further comprising, prior to said applying, manipulating a support structure that supports the push rod so as to position the push rod over the lid and within the periphery of the lid when the lid is positioned over the assembly.

18. The method of claim 17 further comprising locking the support structure into position during said applying.

19. The method of claim 16 wherein said employing the push rod includes lowering a pushing end of the push rod towards the top surface of the lid until the pushing end contacts the top surface of the lid.

20. The method of claim 16 wherein when the push rod is applying the pushing force an axis of the push rod is less than approximately 20 degrees from normal to a plane defined by the top surface of the lid.

* * * * *